US006562528B2

(12) United States Patent
Novak

(10) Patent No.: US 6,562,528 B2
(45) Date of Patent: May 13, 2003

(54) METHOD FOR DETERMINING AND CALIBRATING IMAGE PLANE TILT AND SUBSTRATE PLANE TILT IN PHOTOLITHOGRAPHY

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/884,140

(22) Filed: Jun. 20, 2001

(65) Prior Publication Data

US 2002/0197548 A1 Dec. 26, 2002

(51) Int. Cl.⁷ ............... G03F 9/00; G03C 5/00
(52) U.S. Cl. ........................... 430/22; 430/30
(58) Field of Search ..................... 430/22, 30

(56) References Cited

U.S. PATENT DOCUMENTS

| | | | |
|---|---|---|---|
| 4,040,736 A | 8/1977 | Johannsmeier | 355/43 |
| 4,748,477 A | 5/1988 | Isohata et al. | 355/53 |
| 4,749,867 A | 6/1988 | Matsushita et al. | 250/442.1 |
| 4,978,841 A | 12/1990 | Barrett et al. | 250/548 |
| 5,153,916 A | 10/1992 | Inagaki et al. | |
| 5,194,893 A | 3/1993 | Nishi | 355/53 |
| 5,461,237 A | 10/1995 | Wakamoto et al. | 250/548 |
| 5,475,490 A | 12/1995 | Hirukawa et al. | 356/375 |
| 5,550,635 A | 8/1996 | Saitoh et al. | 356/401 |
| 5,587,794 A | 12/1996 | Mizutani et al. | 356/375 |
| 5,601,957 A | 2/1997 | Mizutani et al. | 430/22 |
| 5,602,400 A | 2/1997 | Kawashima | 250/548 |
| 5,602,619 A | 2/1997 | Sogard | 355/53 |
| 5,668,624 A | 9/1997 | Naraki et al. | 355/53 |

OTHER PUBLICATIONS

Derwent Abstract of U.S. 5,617,182.
Derwent Abstract of U.S. 5,464,715.
Derwent Abstract of U.S. 5,627,627.
Internet printout of Company Profile of ASML.

*Primary Examiner*—Christopher G. Young
(74) *Attorney, Agent, or Firm*—Finnegan, Henderson, Farabow, Garrett & Dunner, L.L.P.

(57) ABSTRACT

A method for determining and calibrating substrate plane tilt and image plane tilt in a photolithography system, which includes subjecting a test substrate to multiple exposure series to form image from which image plane tilt and substrate plane tilt about the first axis can be separately determined. For a first exposure series, two test areas aligned along a second axis are subject to the same exposures at the same position along a third axis orthogonal to the horizontal reference plane. The image from this exposure series would indicate the presence of substrate plane tilt if the relative locations of the best focus images in the test areas were substantially different. For a second exposure series, the substrate plane is stepped along the third axis direction and at least one of the test areas is subjected to the same exposure at different positions in the third axis direction. The image from this second exposure series provides information on the change in position of best focus across the substrate plane, corresponding to changes in substrate position along the third axis direction. Such information is used for determining the image plane tilt and substrate plane tilt with respect to the substrate plane. The image plane tilt and substrate plane tilt information may be used to calibrate the photolithography system for processing production substrates.

16 Claims, 10 Drawing Sheets

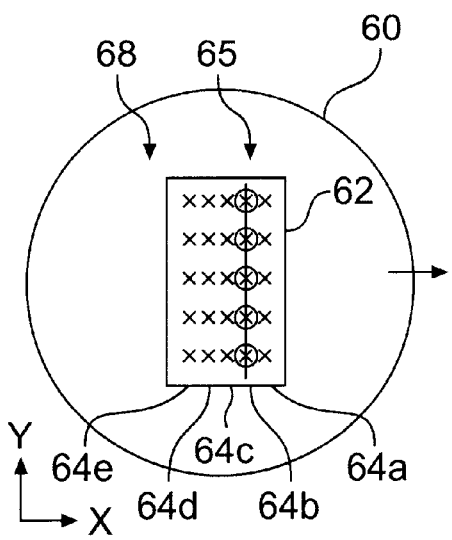
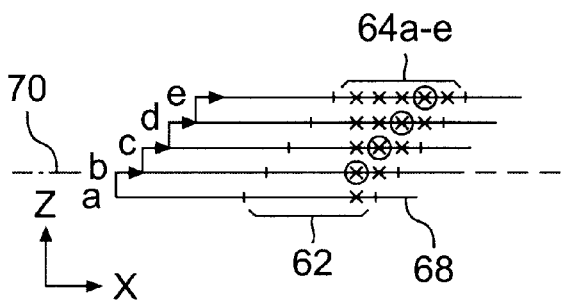
FIG. 3A
PRIOR ART
FIG. 3B
PRIOR ART
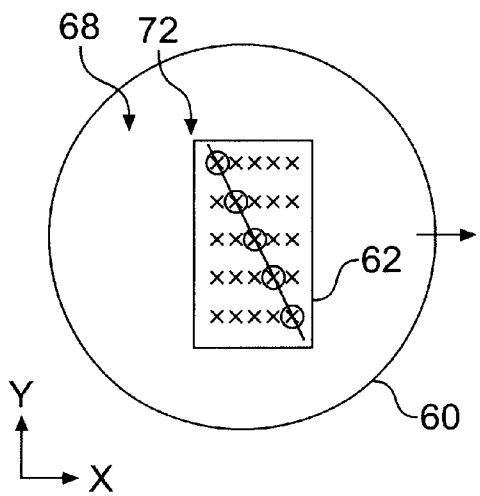
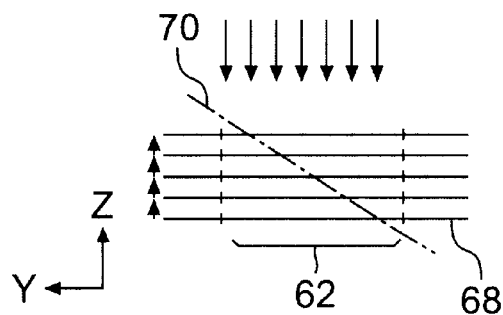
FIG. 4A
PRIOR ART
FIG. 4B
PRIOR ART

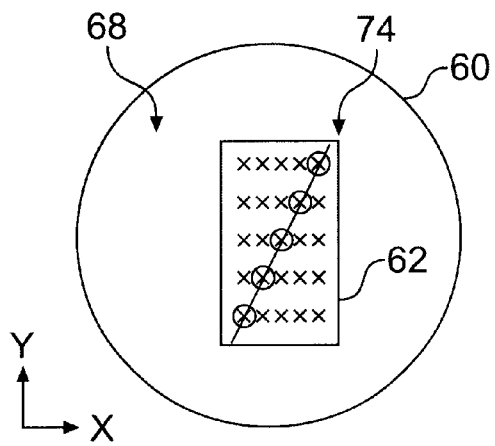
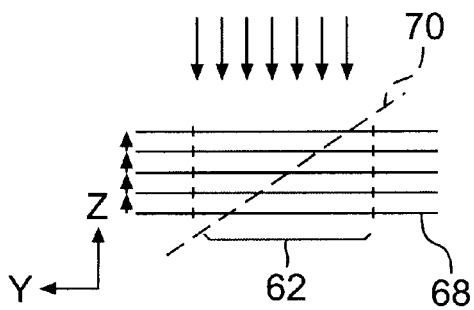
FIG. 5A
PRIOR ART
FIG. 5B
PRIOR ART
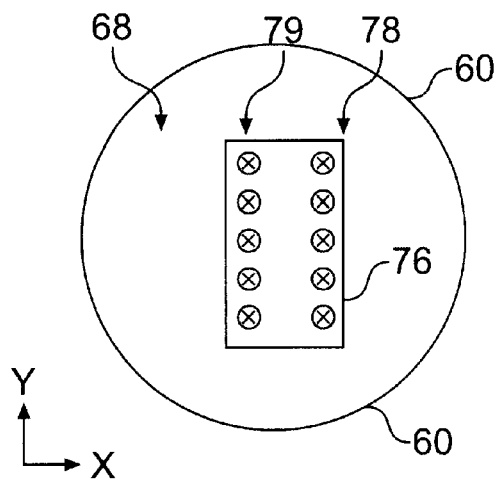
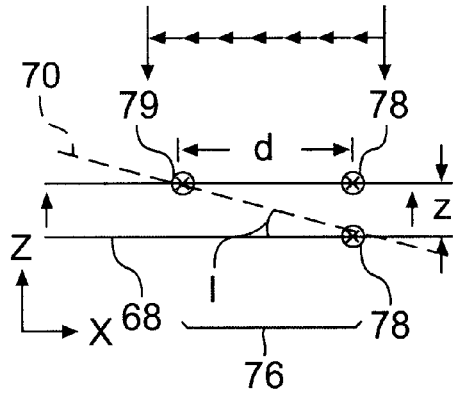
FIG. 6B
FIG. 6A

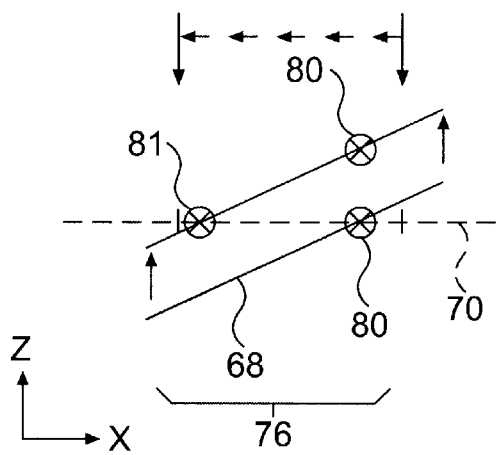
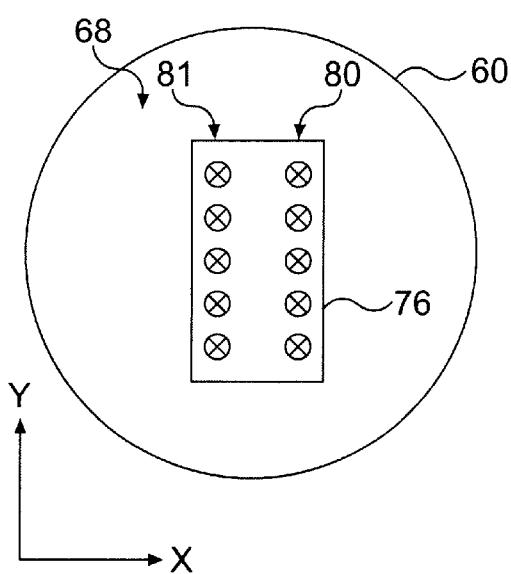
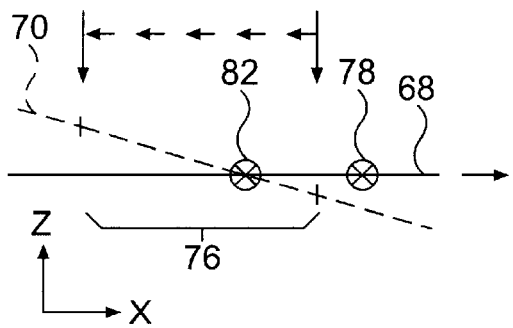
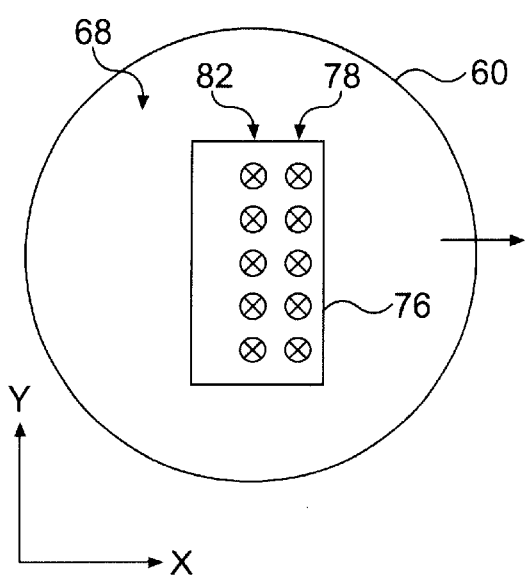

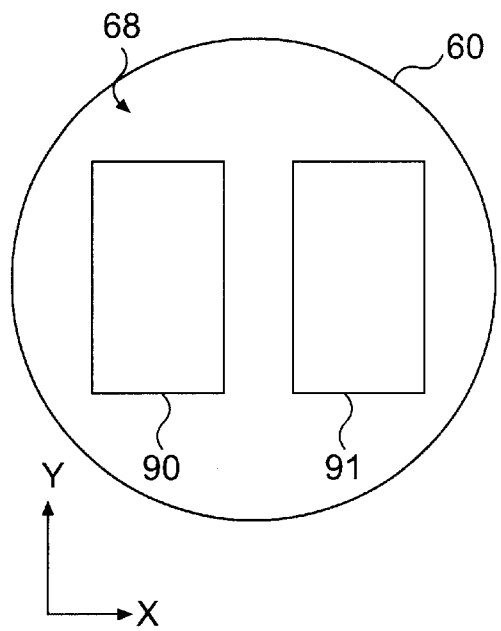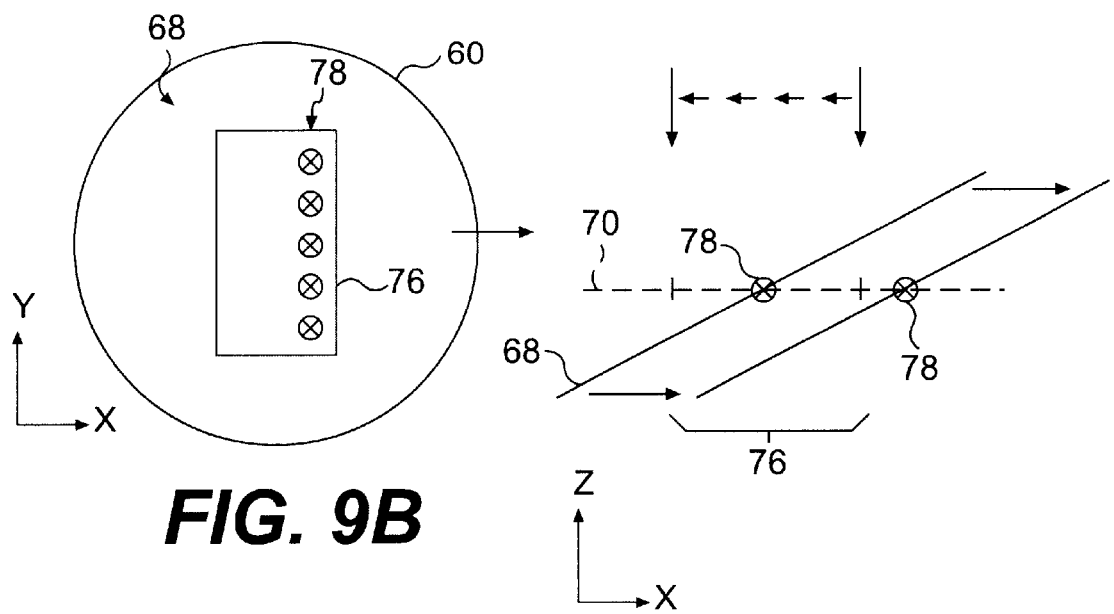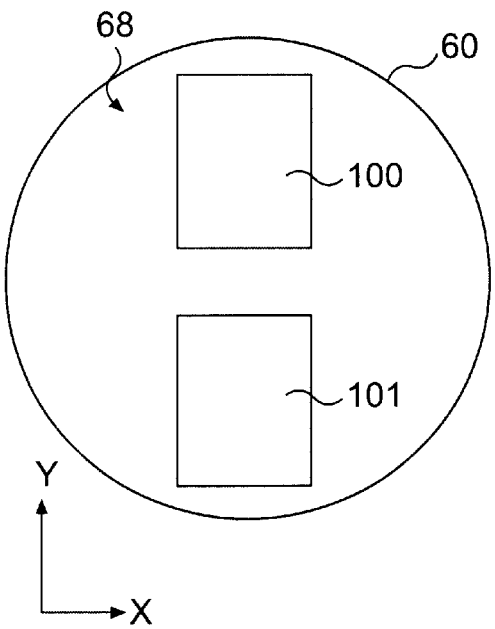
FIG. 9B
FIG. 9A
FIG. 10
FIG. 14

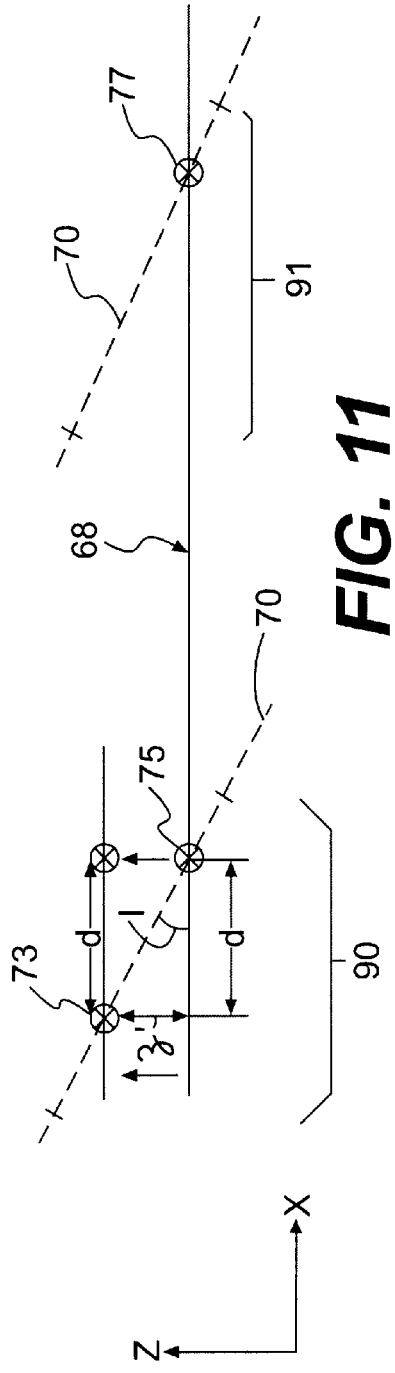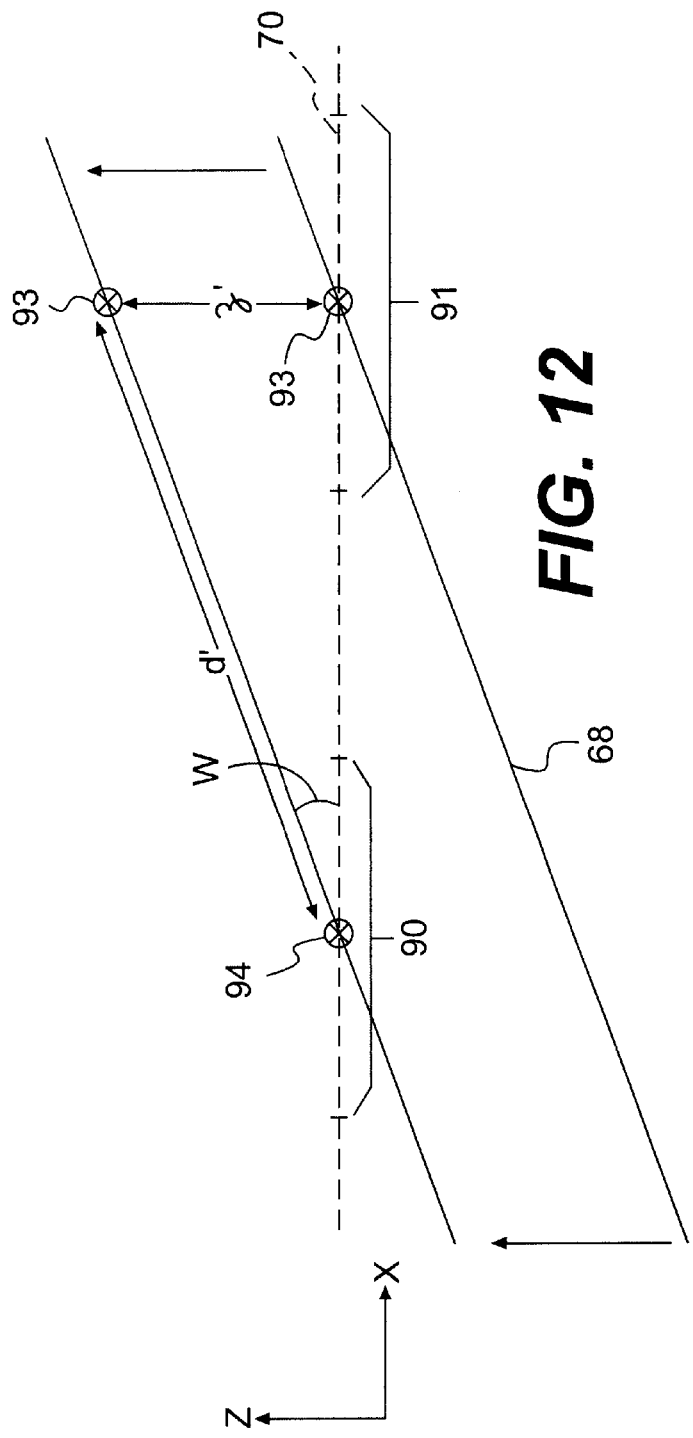

METHOD FOR DETERMINING AND CALIBRATING IMAGE PLANE TILT AND SUBSTRATE PLANE TILT IN PHOTOLITHOGRAPHY

BACKGROUND OF THE INVENTION

1. Field of the Invention

The invention relates to photolithography for fabricating micro devices on a substrate, and particularly to determining substrate plane tilt and image plane tilt of the exposure apparatus in a photolithography system and, more particularly, to determining such tilts of a scanning-type exposure apparatus.

2. Related Background Art

One of the processes involved in the fabrication of micro devices (such as semiconductor devices, liquid crystal display devices, plasma display devices and the like) is photolithography. Generally, this involves imaging a mask pattern formed on a reticle onto a predetermined shot area on a photo sensitized substrate (a wafer or glass plate with photoresist applied thereon), and subsequently developing and processing the exposed substrate to obtain the surface features represented by the mask pattern. Two exposure methods adopted for such photolithography processes are the projection-type exposure method and the scanning-type exposure method.

In the projection-type exposure method, the image of the entire pattern on the reticle is projected onto the substrate at one time. By stepping the substrate, the same image may be repeatedly projected onto sequential areas of the substrate. The projection exposure apparatus for repeating the stepping and projection exposure is called a step-and-repeat apparatus (or stepper).

In the scanning-type exposure method, the reticle and the substrate are typically scanned and exposed synchronously (in accordance with the image reduction, if any, in place) with respect to an illumination area defined by a slit having a predetermined geometry (e.g., a rectangular, hexagonal, trapezoidal or arc shaped slit). This allows a pattern larger than the slit-like illumination area to be transferred to a shot area onto the substrate. After the first shot area has been completed, the substrate is stepped to position the following shot area to a scanning start position. This system of repeating the stepping and scanning exposure is called a step-and-scan system. The scan-type exposure method is especially useful for imaging large reticle patterns and/or large image fields on the substrate, as the exposure area of the reticle and the image field on the substrate are effectively enlarged by the scanning process.

For both exposure methods as well as others, it is important that the photosensitive surface of the substrate be in focus with respect to the projection optics. This is to ensure sharp definition and resolution of the surface features formed by the lithographic process. Focus errors may arise from misalignment of the best focal plane or image plane of the projection optics and the plane of the substrate surface. Such misalignment may arise from imperfections in the orientation of the projection optics (resulting in image plane tilt with respect to the horizontal plane) and/or the orientation of the substrate on its support (resulting in substrate plane tilt with respect to the horizontal plane). The misalignment between the image plane and the substrate plane would result in optimum focus for only part of the entire image field. In view of the impetus to obtain increasingly larger scale integration of surface features at increasingly higher resolution, it is imperative that the image of the reticle be accurately and reliably focused over the entire area of each image field.

Some prior art exposure devices have been provided with an auto-focus feature that automatically adjusts the focus of the reticle pattern onto the substrate surface. However, this feature only ensures that the image field is at overall optimum focus with respect to the projection optics. This feature does not ensure that the entire image field is in optimum focus. For example, in a scanning-type lithography system, since the exposure through the slit at a given instant is an area that is typically relatively narrow in the direction of scan and long in the orthogonal direction, it would be more difficult to ensure that the entire image field is in focus along the entire longitudinal dimension of the image field. For this and other reasons, auto-focus does not work as well for scanning-type exposure systems compared to projection-type exposure systems. The difficulty in achieving focus over the entire image field is exacerbated by the relatively shallow depth of field of the exposure optics because of its relatively large numerical aperture.

Some prior art exposure apparatuses were provided with means for determining the image plane tilt and means for offsetting the misalignment between the substrate surface and the image plane (e.g., by adjusting the substrate tilt position), to minimize focus errors over the entire image field. For example, it is common practice in the semiconductor industry to calibrate various aspects of the lithography system by exposing test patterns on a test substrate. One of the primary aspects to be determined is the optimum focus at different locations on the substrate. Typically, a series of exposures are made on the test substrate, involving changing focus distance and shifting the pattern laterally between exposures to not overlap exposures. The images formed by these exposures are analyzed later to determine the locations on the test substrate which are in optimum focus. Based on these locations, the projection system can be adjusted in terms of overall focus as well as the tilt of the image plane in one or more degrees of freedom.

The above calibration test may be carried out based on the assumption that there is no substrate plane tilt. Such a calibration test may be effective for determining the location of the optimum image plane and the image plane tilt if there is no substrate plane tilt. However, since there is the possibility that the substrate is also tilted, there would be ambiguity in the calibration results with respect to the uncertainty between substrate tilt and image plane tilt. It is therefore desirable to provide a calibration test that can resolve this ambiguity. It is further desirable to provide a calibration test that is simple to carry out in a photolithography process.

SUMMARY OF THE INVENTION

The invention provides a method for determining and calibrating substrate plane tilt and image plane tilt in a photolithography system. This method includes subjecting a test substrate to exposures to form images from which substrate plane tilt can be distinguished from image plane tilt and the two types of tilt can be separately determined. In one aspect of the invention, the presence of substrate plane tilt about a first axis (e.g., Y-axis) is identified by making a series of exposures on a test area with the test substrate shifted, relative to the reticle, along the horizontal reference plane (i.e., zero tilt plane; e.g., X-Y plane) in a direction along a second axis (e.g., X-axis) orthogonal to the first axis. The presence of substrate plane tilt is demonstrated by a shift in the relative locations of the best focus images within the test area. The relative locations of the best focus images within the test area would remain substantially the same if there were no substrate plane tilt about the first axis.

In another aspect of the invention, a multiple exposure series is developed to separately determine image plane tilt and substrate plane tilt about the first axis. At least two exposure series are made in at least two test areas aligned along the second axis direction on the substrate plane. For a first exposure series, the two test areas are subject to the same exposures at the same position along a third axis (e.g., Z-axis) orthogonal to the horizontal reference plane. The image from this exposure series would indicate the presence of substrate plane tilt, based on a comparison of the relative positions of the best focus images within the two test areas. For a second exposure series, the substrate plane is stepped along the third axis direction and one of the test areas is subjected to the same exposure at different positions in the third axis direction. The image from this second exposure series provides information on the change in position of best focus across the substrate plane, corresponding to changes in substrate position along the third axis direction. Such information is used for determining the image plane tilt with respect to the substrate plane.

In the event that substrate plane tilt is present, the image from the second exposure series also provides information relating to the change in position of the substrate plane along the third axis that would render the best focus image in the test area that was subjected to the second exposure series the same as the best focus image in the other test area. The substrate plane tilt about the first axis with respect to the horizontal reference plane is given by the change in position in the third axis direction necessary to obtain the same best focus image in each test area and the distance between the best focus images in the two test areas.

The image plane tilt and substrate plane tilt about the second axis is determined by a similar approach, using two test areas aligned along the first axis. To determine the tilts about the first and second axes at the same time, three test areas may be arranged on the substrate plane in a manner that would separately resolve the tilts about the first and second axes.

The absolute tilt of the image plane about the horizontal reference plane is given by the algebraic sum of the substrate plane tilt angle (relative to the horizontal reference plane) and the image plane tilt angle (relative to the substrate plane). The image plane tilt and substrate plane tilt information may be used to calibrate the photolithography system for processing production substrates.

BRIEF DESCRIPTION OF THE DRAWINGS

FIG. 3A is a schematic plan view of a test wafer illustrating the image formed in a test area for determining the position of an image plane in accordance with a prior art process; FIG. 3B is a schematic sectional view illustrating the relationship of image plane and wafer plane.

FIG. 4A is a schematic plan view of a test wafer illustrating the image formed in a test area for determining image plane tilt in accordance with the prior art process; FIG. 4B is a schematic sectional view illustrating the relationship of wafer plane and image plane.

FIG. 5A is a schematic plan view of a test wafer illustrating the image formed in a test area for determining image plane tilt in another direction in accordance with the prior art process; FIG. 5B is a schematic sectional view illustrating the relationship of image plane and wafer plane.

FIG. 6A is a schematic sectional view illustrating the relationship of a zero tilt wafer plane and a tilted image plane; FIG. 6B is a schematic plan view of the test wafer illustrating the image formed in a test area in accordance with one embodiment of the invention.

FIG. 7A is a schematic sectional view illustrating the relationship of a zero tilt image plane and a tilted wafer plane; FIG. 7B is a schematic plan view of the test wafer illustrating the image formed in a test area in accordance with one embodiment of the invention.

FIG. 8A is a schematic sectional view illustrating the relationship of a zero tilt wafer plane and a tilted image plane; FIG. 8B is a schematic sectional view of the relationship of the image plane and the wafer plane after the latter has been stepped in the X-direction in accordance with one embodiment of the invention; FIG. 8C is a schematic plan view of the test wafer illustrating the image formed in a test area.

FIG. 9A is a schematic sectional view illustrating the relationship of a zero tilt image plane and a tilted wafer plane; FIG. 9B is a schematic plan view of the test wafer illustrating the image formed in a test area.

FIG. 10 is a schematic plan view of a test wafer illustrating the images formed by multiple exposure series for determining tilt about the Y-axis in accordance with one embodiment of the invention.

FIG. 11 is a schematic sectional view illustrating the relationship of a zero tilt wafer plane and a tilted image plane for multiple exposure series.

FIG. 12 is a schematic sectional view illustrating the relationship of a tilted wafer plane and a zero tilt image plane for multiple exposure series.

FIG. 14 is a schematic plan view of a test wafer illustrating the images formed by multiple exposure series for determining tilt about the X-axis in accordance with one embodiment of the invention.

DETAILED DESCRIPTION OF THE ILLUSTRATED EMBODIMENT

The following description is of the best-contemplated mode of carrying out the invention. This description is made for the purpose of illustrating the general principles of the invention and should not be taken in a limiting sense. The scope of the invention is best determined by reference to the appended claims.

For ease of discussion, the determination and calibration of image and object planes in accordance with the invention is described in reference to one embodiment of a scanning-type photolithography system for substrate processing. However, it is understood that the invention may be easily adapted for use in other types of exposure systems for substrate processing (e.g., a projection-type photolithography system) or processing of other articles in which similar calibration is desirable without departing from the scope and spirit of the invention.

Figure 1:
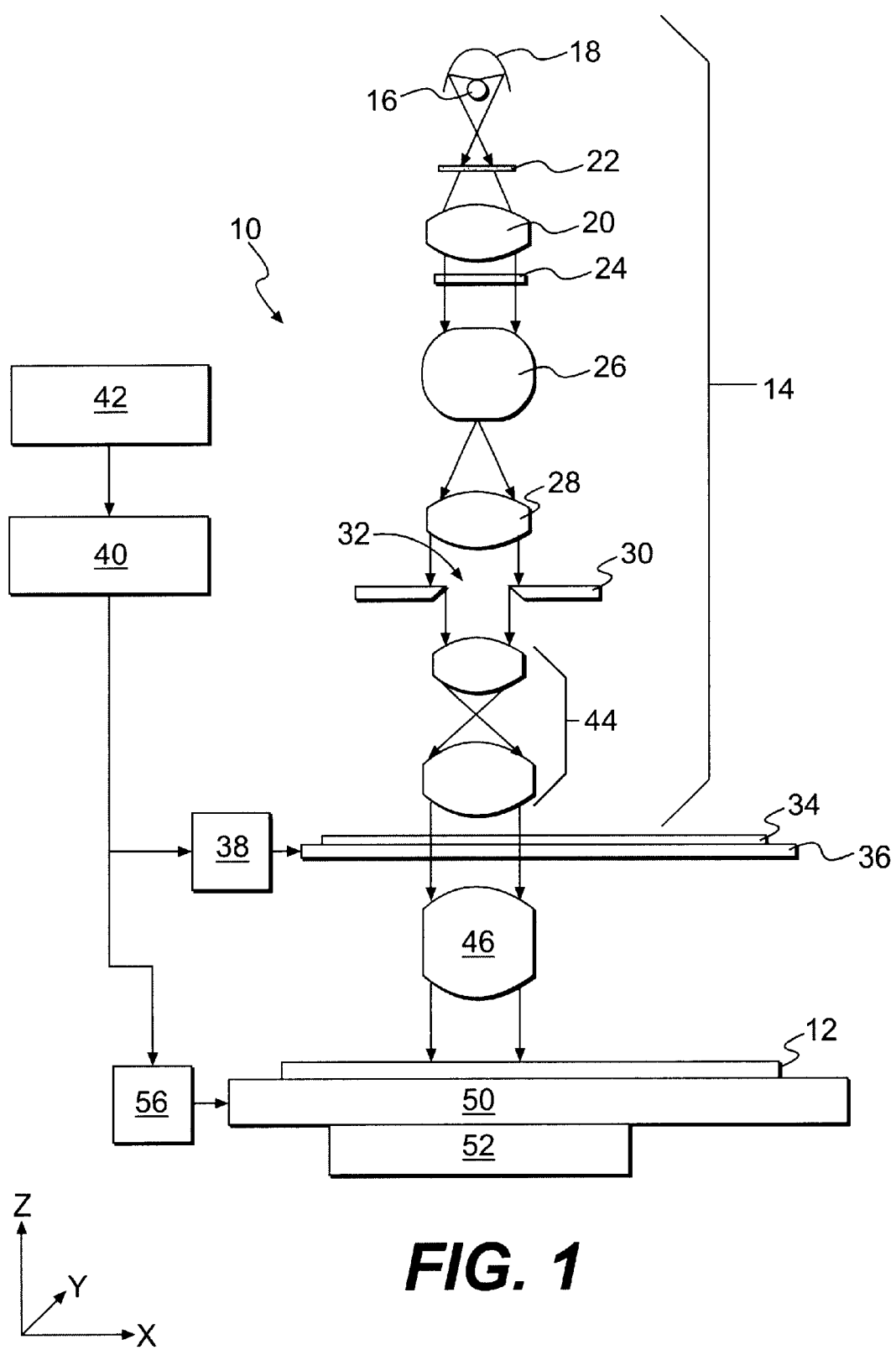
FIG. 1 is a schematic representation of a scanning-type photolithography system that incorporates one embodiment of the invention.

FIG. 1 is a schematic representation of a scanning-type exposure system 10 for processing a substrate, such as a wafer 12, which implements the invention. In an illumination system 14, light beams emitted from an extra-high pressure mercury lamp 16 are converged by an elliptical mirror 18. The converged light beams are incident on a lens 20 via a shutter 22. The lens 20 collimates the light beams passing through the shutter 22 into substantially parallel light beams, and a wavelength selection filter 24 transmits only the light having a wavelength needed for a desired exposure (e.g., exposure of the photoresist on the wafer 12). The light beams passing through the wavelength selection filter 24 are incident in the form of substantially parallel light beams upon a fly's eye integrator 26.

The fly's eye integrator 26 emits lights beams of uniform illumination distribution to a lens 28. The lens 28 collimates these light beams into substantially parallel light beams that are in turn incident upon a field stop 30. The field stop 30, formed with an aperture 32 having a predetermined geometry (e.g., a rectangular slit), regulates the range of illumination of a pattern on a reticle 34 that is mounted on a reticle stage 36. The reticle stage 36 is movable in several (e.g., three to six) degrees of freedom by servomotors 38 under precision control by a drive controller 40 and/or a system computer 42. The light beams passing through the field stop 30 are projected to form an image of the aperture 32 via a lens system 44 on the reticle 34. The light beams penetrating the reticle 34 are projected on the wafer 12 via projection optics.

The wafer 12 is held by vacuum suction on a wafer holder 50 that is supported on a wafer stage 52 under the projection optics 466. The wafer stage 52 is structured so that it can be moved in several (e.g., three to six) degrees of freedom by servo motors 56 under precision control by the drive controller 40 and/or system computer 42, to position the wafer 12 at a desired position and orientation, and to move the wafer 12 relative to the projection optics 46. The drive controller 40 provides the user with information relating to X, Y and Z positions as well as the angular positions of the wafer 12. Upon receiving instructions from the drive controller 40, the servo motors 38 and 56 cause the reticle stage 36 and the wafer stage 52 to effect scanning in synchronism with each other along the Y-axis.

The configuration of the exposure system 10 as illustrated in FIG. 1 generally corresponds to a step-and-scan exposure system. Further details of the components within such a system may be referenced from U.S. Pat. No. 5,194,893 to Nishi and U.S. Pat. No. 5,668,624 to Naraki et al. (assigned to the assignee of the present invention), which are fully incorporated by reference herein. It is to be understood that the invention disclosed herein is not to be limited to wafer processing systems, and specifically to step-and-scan exposure systems for wafer processing. The general reference to a step-and-scan exposure system is purely for illustrating an embodiment in an environment in which the concept of determination and calibration of image and object planes of the invention may be advantageously adopted.

Figure 2:
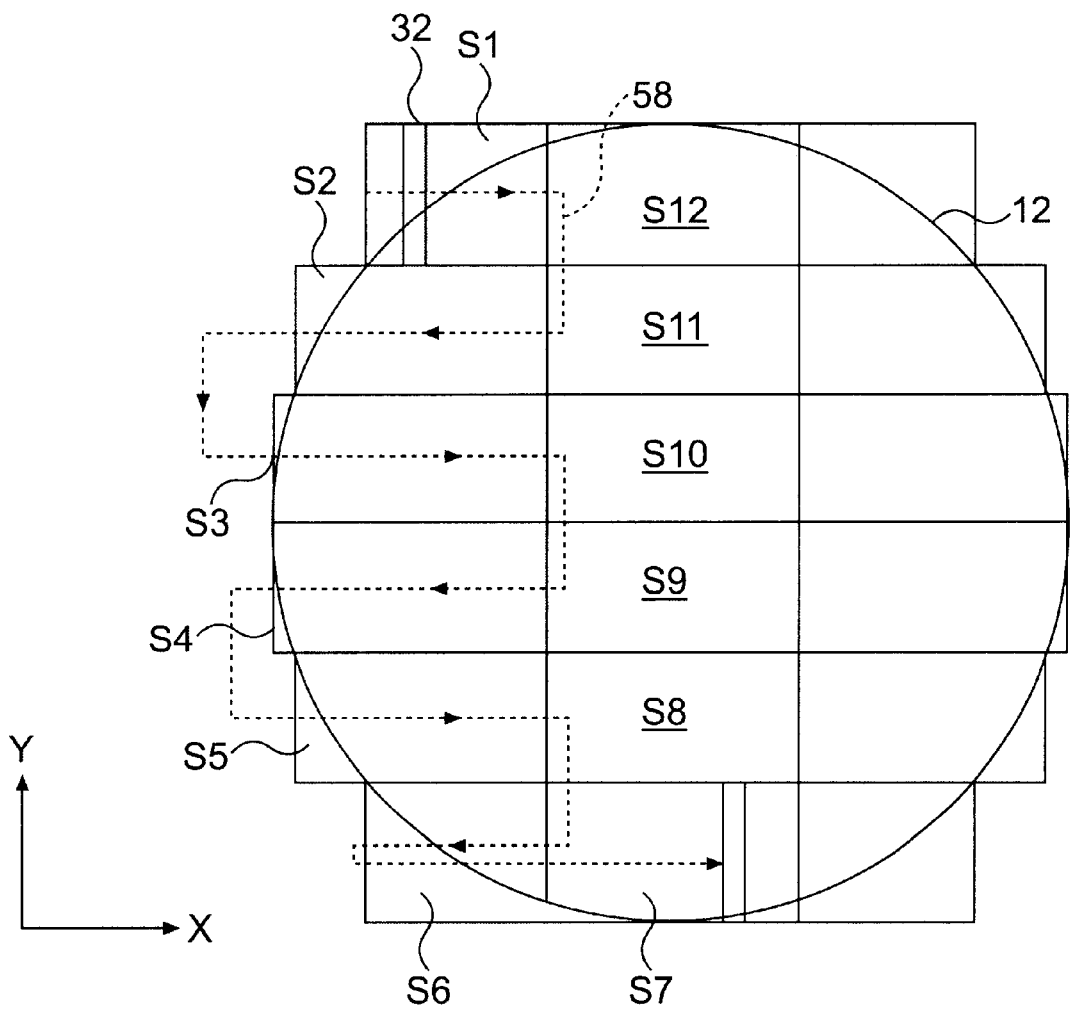
FIG. 2 is a schematic plan view of a wafer illustrating the step-and-scan exposure method.

FIG. 2 is a plan view illustrating the sequence of the step-and-scan exposure method. A shot area S1 on the photoresist-covered wafer 12 is scanned in the X-direction with the illumination through the rectangular shaped aperture 32 of the field stop 30. The wafer 12 is stepped in the Y-direction and a shot area S2 is scanned. The broken line 58 shows the sequence of exposure during the step-and-scan process, so that the exposure is carried out on shot areas S1 to S6 in this order, and then on shot areas S7 to S12 arranged in the Y-direction in the center of the wafer 12, and so on.

As mentioned in the background section, it is important to ensure that the image plane of the projection optics 46 is focused squarely on (i.e., aligned with) the wafer surface (i.e., the object plane or wafer plane). Any image plane tilt and wafer plane tilt must be distinguished and determined using a test wafer before any adjustments to the image plane and/or wafer plane can be effected to align the two planes. Heretofore, prior art calibration tests apply a single series of exposures on the test wafer, which would not resolve the ambiguity between image plane tilt and wafer plane tilt. According to one embodiment of the invention, the test wafer is subjected to multiple series of exposures. The image plane tilt can then be easily distinguished from the wafer plane tilt.

Before discussing the inventive approach to determining and calibrating the image plane tilt and wafer plane tilt, it would be beneficial to discuss in detail the deficiencies of the single series exposure approach of prior art calibration tests. It is noted that throughout the discussion below, the X, Y and Z-axes are orthogonal to each other. Further, the X and Y-axes will be used to denote the horizontal (zero tilt) reference plane. In the sectional drawings showing the orthogonal planes (X-Y and X-Z planes), all image plane tilt and wafer plane tilt will be exaggerated to improve visualization of the effect of these tilts.

FIG. 3A depicts a test area 62 on the wafer plane 68 of a test wafer 60 in which a series of exposures 64a to 64e are made by a scanning-type lithography system. (For ease of illustration, the test area 62 is enlarged in reference to the circular surface of the test wafer 60. The test area 62 is substantially smaller in the actual implementation.) A single line of targets (64a to 64e) from the reticle is exposed on the test wafer 60 at any point in time. Each line (64a to 64e) corresponds to the image of the rectangular field stop. Referring also to FIG. 3B (which shows the test area 62 in reference to the image plane 70 of the exposure optics), after the first exposure has been made, and keeping the reticle 34 stationary, the test wafer 60 is then moved in the X-direction and in the Z-direction and another exposure is made. (The series of exposures would appear to progress in the negative X-direction relative to the test wafer 60.) This is repeated many times, typically fifteen exposure steps. For the sake of simplicity, only five exposure steps (64a to 64e) are shown in FIG. 3A. To increase the probability that the line of best focus will fall within the series of exposures, the middle of the range of Z-direction steps is set to be the nominal best focus position if the exposure optics had been adjusted correctly prior to making the series of exposures. The images from the exposures (64a to 64e) on the test wafer 60 are subsequently developed and analyzed to determine the locations that are in optimum focus.

In the example shown in FIG. 3A, a line of best focus 65 is oriented along the Y-direction, and is offset to the right of the nominal focus center of the test area 62 by one exposure step. This would indicate that the projection optics is out of focus adjustment by an amount corresponding to one incremental change in focus (in the Z-direction) between each exposure step. For example, if adjacent exposures were made using a ten-micrometer incremental step, then in the example depicted in FIG. 3A, the result would indicate that the machine focus is in error by ten micrometers from the nominal focus at the center of the test area 62.

The example in FIG. 3A represents the ideal situation where there is no relative tilt between the image plane 70 and the wafer plane 68 about the X and Y-axes. Under this condition, the line of best focus 65 is entirely along the Y-direction. If the line of best focus were inclined at an angle to the Y-axis (see lines of best focus 72 and 74 in FIGS. 4A and 5A, respectively), it would indicate that the image plane 70 is tilted relative to the wafer plane 68 about the X-axis. The reason for the inclination of the line of best focus is that only one point of best focus is possible at each exposure step in the presence of relative tilt between the image plane 70 and the wafer plane 68 about the X-axis. Specifically, referring to FIGS. 4A and 4B, given a direction of wafer step movement in the positive X-direction (i.e., the exposure progresses in the negative X-direction relative to the test wafer 60), a counterclockwise inclination of the line of best focus 72 corresponds to a clockwise tilt of the image plane 70 with respect to the wafer plane 68 about the X-axis (when viewed in the positive X-direction). Referring to FIGS. 5A and 5B, a clockwise inclination of the line of best focus 74 corresponds to a counterclockwise tilt of the image plane 70 with respect to the wafer plane 68 about the X-axis. The inclination of the line of best focus would be in the opposite direction for the same relative tilt between the image plane 70 and the wafer plane 68, if the wafer step movement were in the opposite direction (negative Z-direction). It is noted that the wafer plane 68 is illustrated to be horizontal in FIG. 4B and 5B for simplicity. The wafer plane 68 may be tilted as well.

It can be appreciated that one of the limitations of the prior art calibration test procedure depicted in FIGS. 3 to 5 is that there is insufficient information available to resolve the ambiguity of whether the image plane 70 or the wafer plane 68 is tilted, or both are tilted, with respect to the horizontal plane. This ambiguity would result in an inaccurate calibration value to be used for aligning the wafer plane 68 with the image plane 70.

The multiple exposure series in accordance with the invention is now discussed. In one aspect of the invention, one of the exposure series is developed for determining relative tilt between the image plane 70 and the wafer plane 68 about the Y-axis. FIG. 6A illustrates the situation in which the image plane 70 is tilted clockwise about the Y-axis and the wafer plane 68 is horizontal. The presence of relative tilt between the image plane 70 and wafer plane 68 about the Y-axis may be detected by subjecting the test area 76 on the test wafer 60 to a series of scanning exposures in the X-direction (the reticle 34 being moved in synchronization with the test wafer 60 in the X-direction). The plane of best focus of the scanning exposures corresponds to the image plane 70. Accordingly, the scanning exposures are represented as image plane 70 in the relevant drawings. If the image plane 70 and the wafer plane 68 were perfectly aligned, the resultant image would show that the entire test area 76 would be in best focus.

Assuming there is no relative tilt of the image plane 70 and the wafer plane 68 about the X-axis, the presence of only a line of best focus (depicted by a point 78 in the two dimensional sectional view in FIG. 6A) in the Y-direction in the resultant image (FIG. 6B) indicates that there is relative tilt between the image plane 70 and the wafer plane 68. (If in addition there were relative tilt of the image plane 70 and the wafer plane 68 about the X-axis, there would be a point of best focus instead of a line of best focus.) If another scanning exposure is made with the test wafer 60 stepped by a distance z in the Z-direction, the resultant image will show that the line of best focus 78 has shifted laterally to line 79 across the wafer plane in the example illustrated in FIG. 6A. The angle I (in radians) of the image tilt is approximated by z divided by d (for relatively small angles expected of the tilt misalignment).

The foregoing exposure series alone does not contain sufficient information for distinguishing between image plane tilt and wafer plane tilt. Similar image results will be obtained for the situation in which the image plane 70 is horizontal and the wafer plane 68 is tilted counterclockwise about the Y-axis, as illustrated in FIG. 7A. When the same scanning exposure series is applied at two Z-positions, the resultant image would show lines of best focus 80 and 81 (FIG. 7B), and would have similar characteristics as the image in FIG. 6B. The above exposure series alone therefore does not provide sufficient information for use in resolving the ambiguity between image plane tilt and wafer plane tilt. The above exposure series alone likewise does not provide sufficient information to resolve the same ambiguity for the situation in which both the image plane 70 and the wafer plane 68 are tilted.

According to another aspect of the invention, an exposure series is developed for conclusively identifying the presence of wafer plane tilt, and distinguishing between image plane tilt and wafer plane tilt about the Y-axis. Making a series of scanning exposures with the wafer 60 shifted in the X-direction only relative to the reticle 34 can identify the presence of wafer plane tilt. The analysis of this exposure series may be understood by reference to FIGS. 8 and 9. Referring to FIGS. 8A–C, and using the example illustrated in FIG. 6A in which the wafer plane is horizontal and the image plane 70 is tilted about the X-axis, when the test wafer 60 is shifted in only the X-direction (FIG. 8A) relative to the reticle 34, the line of best focus 78 would shift laterally from the right to the left of the wafer plane. However, for the example illustrated in FIG. 7A in which the wafer plane is tilted about the X-axis and the image plane 70 is horizontal, when the test wafer 60 is shifted in only the X-direction relative to the reticle 34, the line of best focus 78 does not shift across the wafer plane (FIGS. 9A and 9B). Accordingly, simply obtaining the image of a similar exposure series at a different X-position and comparing the images at the different X-positions can positively identify the presence of wafer plane tilt. The image plane tilt and wafer plane tilt about the X-axis may be distinguished by a similar approach.

In the case of a combination of image plane tilt and wafer plane tilt, when the test wafer 60 is shifted in only the X-direction, it can be readily visualized that the line of best focus would shift across the wafer plane 68. The amount of this shift in the line of best focus depends on relative tilts of the wafer plane and the image plane with respect to the horizontal plane. When the image plane and the wafer plane tilt in opposite directions relative to the horizontal plane, the amount of the shift in the line of best focus would be smaller than the shift experienced in the case of zero wafer plane tilt depicted in FIG. 8B, but definitely more than the case of zero shift depicted in FIG. 9B. When the image plane and the wafer plane tilt in the same direction relative to the horizontal plane, the shift in the line of best focus would be larger than the shift experienced in the case of zero wafer plane tilt depicted in FIG. 8B.

Accordingly, using the foregoing approach, the image plane tilt and wafer plane tilt can be distinguished. The amount of image plane tilt and wafer plane tilt can then be separately determined and applied towards calibration.

According to a further aspect of the invention, a multiple exposure series is developed for separately determining and calibrating the image plane tilt and wafer plane tilt. The determinations of image plane tilt and wafer plane tilt about the X and Y-axes, respectively, require two or more series of exposures on different areas of the test wafer 60. Referring to FIG. 10, for a first exposure series, the exposure apparatus and the wafer stage 52 are controlled in a manner such that two test areas (90, 91) along the X-direction (one at each side of the test wafer 60) are each subjected to scanning exposure by the same portion of the reticle 34 and at the same starting Z-position. For a second exposure series, at least one of the test areas is subjected to the same series of exposures at one or more different Z locations (i.e., for determining the image plane tilt relative to the wafer plane) in a manner similar to the process explained above in connection with FIGS. 6A–B. It is noted that the first and second exposure series may be carried out in any order, since it is the overall resultant image of both exposure series that will be analyzed to determine the image plane tilt and wafer plane tilt.

Referring to FIG. 11, the two test areas (90, 91) have the same resultant image of best focus at the same Z-position. That is, the images of the test areas (90, 91) show that the line of best focus 75 (a point of best focus if there is also relative tilt about the X-axis) in the test area 90 and the line of best focus 77 in the test area 91 are located at the same relative location within the respective test areas, and these lines of best focus are the result of exposure carried out at the same Z-position. One can then conclude that the wafer plane 68 is not tilted about the Y-axis. Such result corresponds to the analysis of the situation depicted in FIGS. 8A–C.

Once it has been determined that there is no wafer plane tilt, the image plane tilt may be determined in the same manner as for the situation depicted in FIGS. 6A–B. The difference z in Z-positions divided by the distance d (along the wafer plane) between two lines of best focus 75 and 73 within the same test area 90, for example, is an approximation of the angle I in radians that the image plane 70 is tilted about the Y-axis. It is noted that Z positions for the lines of best focus are available from the exposure system 10 which can be easily correlated to the corresponding lines of best focus, since the exposure system 10 controls both the wafer stage Z-direction movements and the exposure sequence.

FIG. 12 shows the case in which the image plane 70 is horizontal, and the wafer plane 68 is tilted. In this case, the image of the first exposure series will show that the two test areas (90, 91) do not have similar images of best focus at the same Z-position. Without stepping the test wafer 60 in the Z-direction, the scanning exposure (image plane 70) will intercept the wafer plane 68 in the test area 91 and not the test area 90. That is, only the image in the test area 91 shows a line of best focus 93. Such result corresponds to the situation depicted in FIGS. 9A–B. For the second exposure series, by stepping the test wafer 60 upwards, a line of best focus is obtained in the test area 90. At a certain Z-position, a line of best focus 94 would be found at the same relative location within the test area 90, as compared to the line of best focus 93 in the test area 93. Accordingly, one can conclude from the images at the different Z-positions that there is wafer plane tilt about the Y-axis, and can determine the change in Z-position to obtain the same best focus image in the test area 90. This result applies also for the combined image plane tilt and wafer plane tilt, which will be discussed below.

Once it has been determined that there is wafer plane tilt, the angle of the wafer plane tilt may be determined from the lateral distance (along the wafer plane) between the lines (or points) of best focus found in the two test areas and their respective Z-positions at which similar best images are found. The difference z' in Z-positions divided by the lateral distance d' is an approximation of the angle W in radians that the wafer plane 68 is tilted about the Y-axis. The same calculation applies to the situation of combined image plane tilt and wafer plane tilt as discussed below.

Figure 13A:
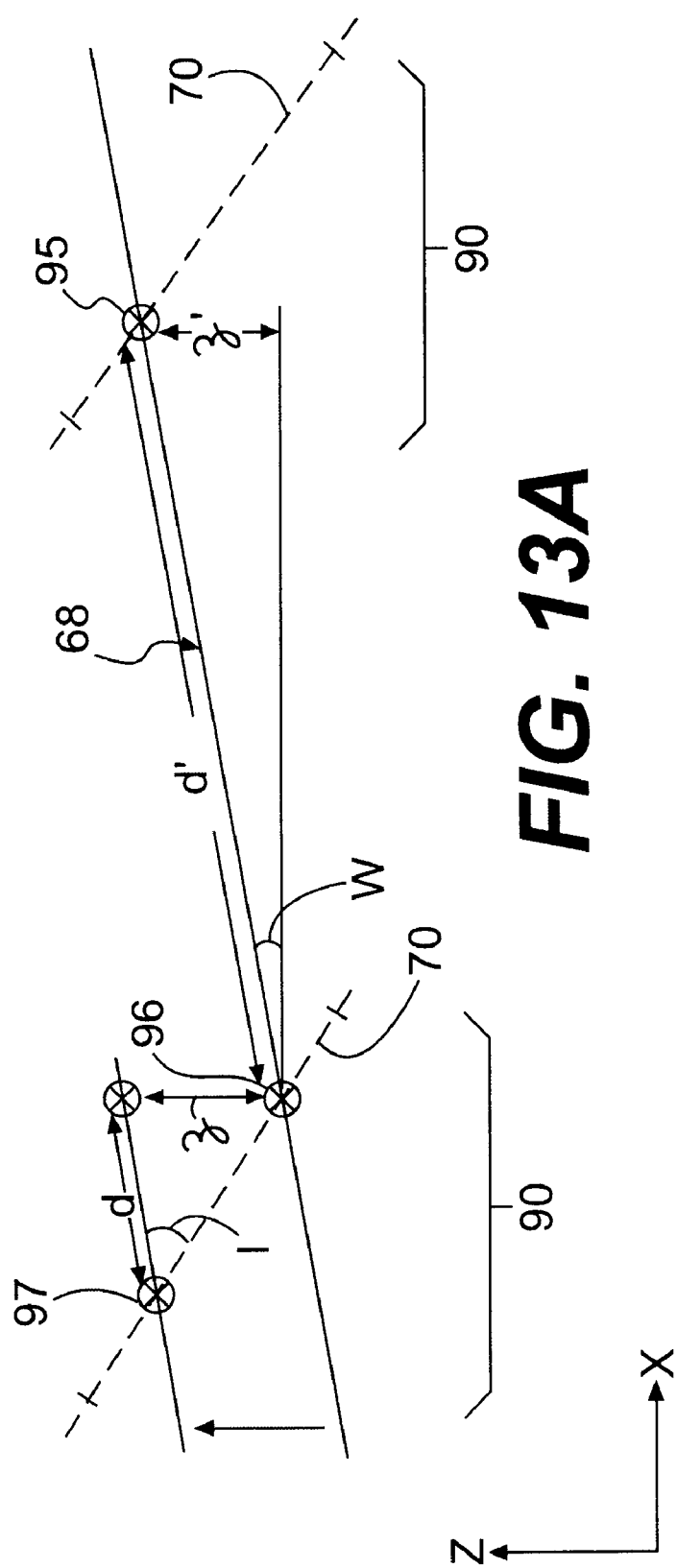
FIG. 13A is a schematic sectional view illustrating the relationship of a tilted wafer plane and a tilted image plane for multiple exposure series.

For the situation where there is combined image plane tilt and wafer plane tilt about the Y-axis, there are two scenarios here. The first scenario is where the best focus images are found in both test areas (90, 91) after they are scanned at the same Z-position, as illustrated in FIG. 13A. In this scenario, the resultant images of the test areas (90, 91) from the first exposure series show that the line of best focus 95 is at a different location within the test area 91 when compared to the line of best focus 96 in the test area 90. Specifically, as illustrated in FIG. 13A, the line of best focus 75 is closer to the right edge of test area 90 compared to the line of best focus 70 that is closer to the left edge of test area 91. As explained before, the different images of line of best focus for the two test areas (90, 91) indicate that that there is wafer plane tilt. For the second exposure series, the test wafer 60 is stepped upwards and after a distance z', the line of best focus 97 is formed at the same relative location within the test area 90 as compared to the line of best focus 95 within the test area 91. The angle W (in radians) of the wafer plane tilt is approximated by z' divided by d'.

Figure 13B:
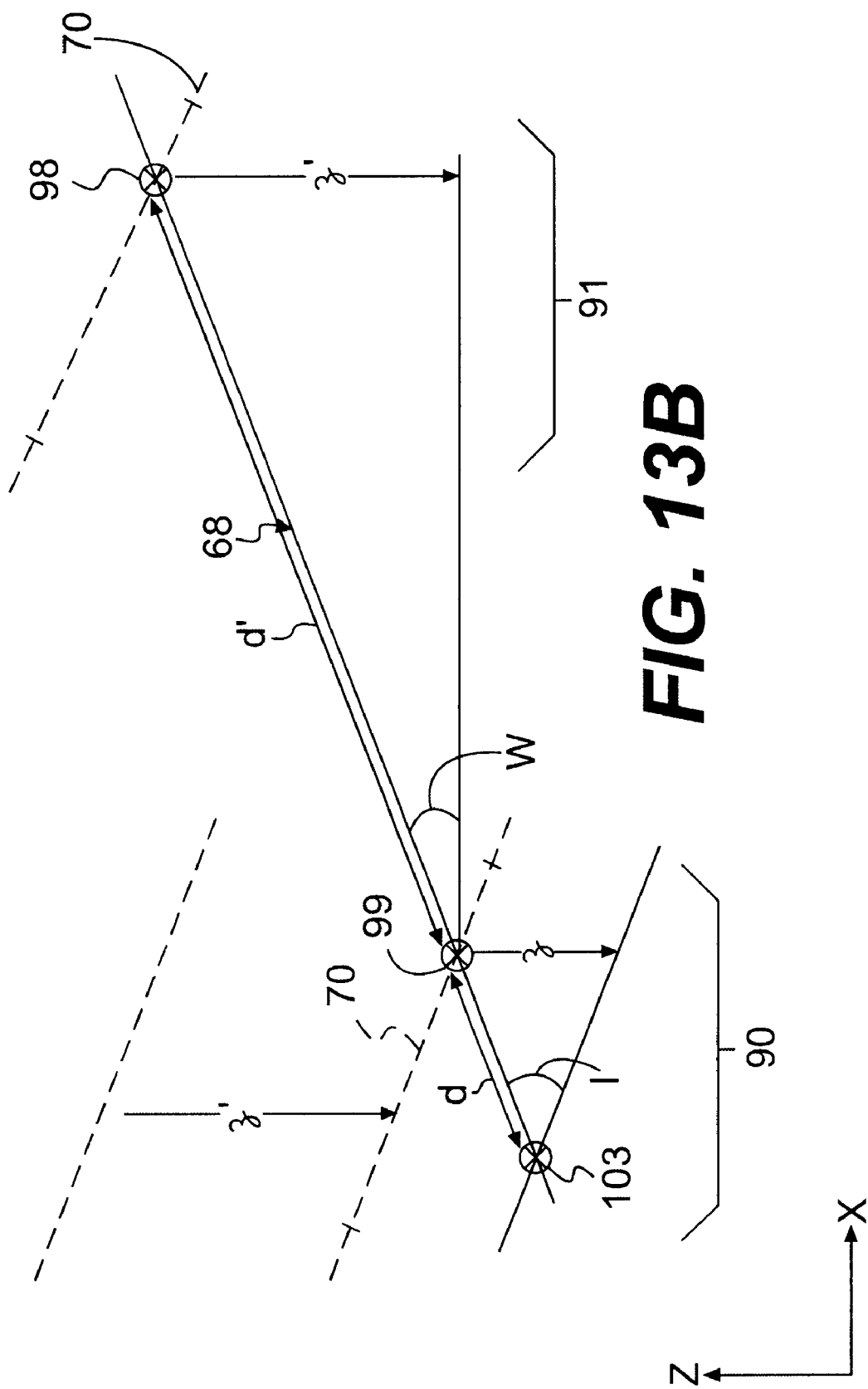
FIG. 13B is a schematic sectional view illustrating the relationship of another scenario of a tilted wafer plane and a tilted image plane for multiple exposure series.

The second scenario is where, because of the tilt of the wafer plane 68, the images in the test areas (90, 91) have to be scanned at different z-positions in order to be able to obtain a best focus image in one of the test areas (test area 90 in this example), as illustrated in FIG. 13B (similar to the situation depicted in FIG. 12). The scanning exposures at different Z-positions are effected similar to that depicted in FIGS. 6A–B (for determining image plane tilt), by stepping the test wafer 60 upwards. (In FIG. 13B, the image plane 70 is shown to have been moved downwards for the test area 90. This is done to simplify the illustration of relative upward stepping of the wafer plane 60.) As in the first scenario, the angle W (in radians) of the wafer plane tilt is approximated by z' divided by d', where z' is the distance between Z-positions corresponding to similar best focus images within both test areas (i.e., line of best focus 99 at the same relative location as line of best focus 98 within the respective test areas).

With respect to the image plane tilt, the angle of image plane tilt is determined by comparing the lines of best focus obtained at different Z-positions within the same test area (test area 90 in both examples of FIG. 13A and FIG. 13B). In FIG. 13A, the lines of best focus 96 and 97 are obtained at different Z-positions by stepping the test wafer upwards. In FIG. 13B, the lines of best focus 99 and 103 are similarly obtained at different Z-positions. For each scenario, the angle I (in radians) of the image plane tilt is approximated by z divided by d. In the case of FIG. 13A, because the line of best focus is used for determining both wafer plane tilt and image plane tilt, it happens that z=z'.

It is noted that the angle I of image plane tilt is not referenced to the horizontal plane, but to the wafer plane 68. For relatively small angles expressed in radians, it is within very good approximation that the actual angle of the image plane 70 with respect to the horizontal plane is given by (I+W), with due consideration of the senses of the angles I and W about the horizontal plane (i.e., different signs for clockwise and counterclockwise angles from the horizontal plane).

Tilt of the wafer about the X-axis can be determined by the same technique discussed above, but by shifting the wafer in the Y-direction instead. In practice, for a narrow exposure field in a scanning-type photolithography system which has a longer dimension in the Y-direction, wafer plane tilt about the X-direction may be of more significance than tilt about the Y-axis because of the exposed area. Referring to FIG. 14, the exposure system 10 and the wafer stage 52 are controlled in a manner such that two test areas (100, 101) along the Y-direction, one at each side of the test wafer 60, are subjected to scanning exposure by the same portion of the reticle 34. Further, both test areas (100, 101) are subjected to the same series of exposures in the Z directions (i.e., for determining image plane tilt angle in the manner explained above in connection with FIGS. 6A–B).

The foregoing determinations of image plane tilt and wafer plane tilt assume no additional changes or errors such as machine instability, which are often small in a lithography system. Another assumption is that the wafer surface is smooth and flat. A further assumption is that the lithography system is adjusted so that the X and Y motions of the wafer stage 52 and reticle stage 36 are perpendicular to the nominal optical axis along the vertical.

Figure 15:
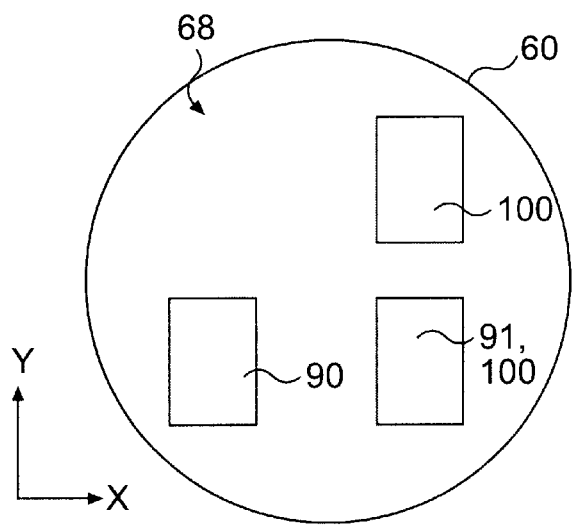
FIG. 15 is a schematic plan view of a test wafer illustrating the images formed by multiple exposure series for determining tilt about the X and Y axes in accordance with one embodiment of the invention.
Figure 16:
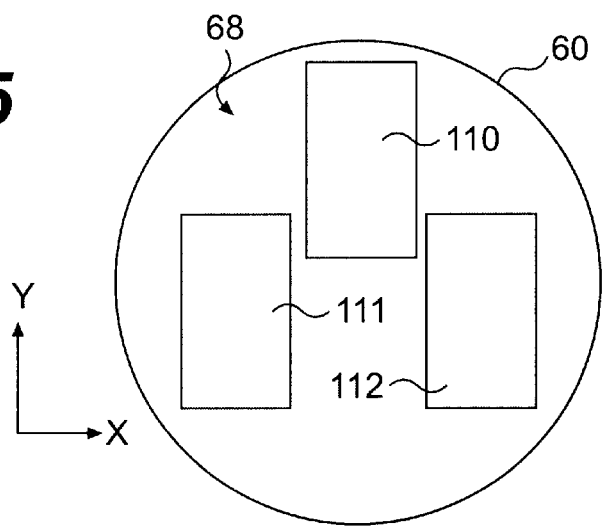
FIG. 16 is a schematic plan view of a test wafer illustrating the images formed by multiple exposure series for determining tilt about the X and Y axes in accordance with another embodiment of the invention.

It is noted that the image plane tilt and wafer plane tilt about the X and Y-axes may be independently determined from an integrated surface arrangement of test areas. For example, the surface arrangement of test areas (100, 101) in FIG. 14 may be integrated with the surface arrangement of test areas (90, 91) in FIG. 10, to form a generally L-shaped configuration illustrated in FIG. 15. Alternatively, a hybrid arrangement is illustrated in FIG. 16 in which three test areas (110, 111, 112) may be used to independently determine the image plane and wafer plane tilt about the X and Y-axes. The test areas 111 and 112 are aligned in the X-direction and the test area 110 is aligned in the Y-direction between the test areas 111 and 112. The detection and determination of image plane tilt and wafer plane tilt is similar to the approach taken in connection with FIGS. 10 and 14. It is noted that for determining tilts about the Y-axis, the best focus image in the test area 110 may be compared to an image obtained by averaging the corresponding images in the test areas 112 and 113. In this case, the quantity of data and hence the total number of exposures need not be three times more than that of a single exposure series. Each exposure series can have fewer but larger steps. The data so obtained may be averaged statistically to determine the parameters of interest. It has been found that an increase of about 70% more than the amount of data for a prior art single exposure series would be sufficient to obtain results that are equal in uncertainty as compared to the prior art method (discounting the fact that the prior art method assumes either no tilt of the wafer plane 68 or no tilt of the image plane 70).

Other configurations of test areas for determining image plane tilt and wafer plane tilt about the X and Y axes may be developed without departing from the scope and spirit of the invention.

Figure 17:
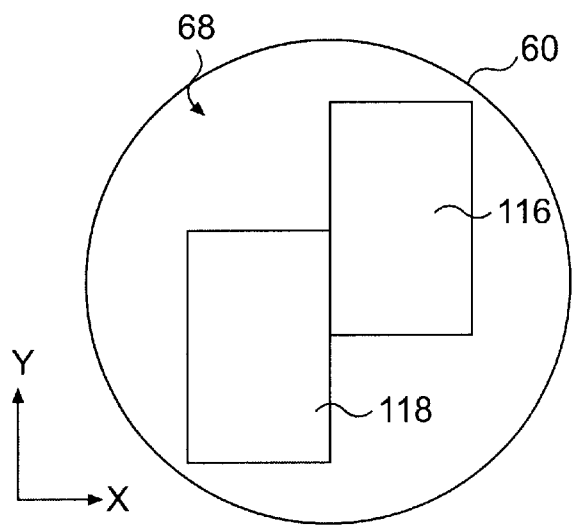
FIG. 17 is a schematic plan view of a test wafer illustrating an example of the images formed by multiple exposure series which is not sufficient for determining tilt about the X and Y axes.

FIG. 17 illustrates two test areas 116 and 118 on the wafer surface which are shifted in both X and Y. It is noted that this configuration does not provide sufficient information to resolve independently the image plane tilt and wafer plane tilt about the X and the Y-axes.

The above described image and object plane calibration process is carried out by the drive controller 40 and/or a computing device such as the system computer 42, that is programmed with the functionalities of the above-described calibration process. Given the disclosure of the various functions of the calibration process, it is within the conventional skill of a software programmer to develop the appropriate program code to implement the process.

The calibration information obtained with the test wafer 60 may be input into the exposure system 10, and is applied by the drive controller 40 and/or the system computer 42 to control the servo motors 38 and 56 for the reticle stage 36 and wafer stage 52, so as to align the image plane 70 and the wafer plane 68 of a production wafer that is subsequently placed in the exposure system 10 for processing.

While the invention has been described with respect to the described embodiments in accordance therewith, it will be apparent to those skilled in the art that various modifications and improvements may be made without departing from the scope and spirit of the invention. For example, the scanned images may have a different geometry. The configuration and geometry of the test areas may also be different. The sequence of exposures may vary without departing from the concept of the invention. Further, the invention may be adopted in a stepping-type exposure apparatus to test image plane tilt and wafer plane tilt. Accordingly, it is to be understood that the invention is not to be limited by the specific illustrated embodiments, but only by the scope of the appended claims.

What is claimed is:

1. In a photolithography system having an exposure apparatus that exposes a pattern onto a photosensitive surface in a substrate plane of a substrate that nominally lies in an image plane of the exposure apparatus defined by two orthogonal axes, a method for determining image plane tilt and substrate plane tilt about at least one of the orthogonal axes, comprising:

subjecting a first test area to a series of exposures across the first test area;

subjecting a second test area, which is displaced from the first test area in a direction of a first orthogonal axis, to a substantially same series of exposures across the second test area;

developing images from the exposures in the first and second test areas, wherein the image in each test area includes an image of at least a line of best focus where the image plane and the substrate plane coincide; and identifying a presence of substrate plane tilt and image plant tilt about the second axis by comparing the images in the first and second test areas.

2. The method of claim 1, wherein a presence of substantially similar images of the line of best focus in the first and second test areas indicates substantially no substrate plane tilt about the second axis, and wherein absence of similar images of the line of best focus in the first and second test areas indicates the presence of substrate plane tilt about the second axis.

3. The method of claim 1, further comprising determining a magnitude of the substrate plane tilt based on the images of the line of best focus in the first and second test areas.

4. The method of claim 3, further comprising the determining a magnitude of an image plane tilt about the second axis based on the image of the line of best focus in the first test area.

5. The method of claim 1, further comprising:

subjecting a third test area to a substantially same series of exposures across the third test area, wherein the third test area is displaced from the first and second test areas in a direction of the second axis;

developing an image from the exposures in the third test area, wherein the image in the third test area includes an image of at least a line of best focus where the image plane and the substrate plane coincide; and determining substrate plane tilt and image plane tilt about the first axis based on the images of the line of best focus in the third test area and the first and/or second test areas.

6. The method of claim 5, wherein the image of the line of best focus in the third test area is compared to the image or images of the line of best focus in the first and/or second test areas to identify the presence of substrate plane tilt, wherein the presence of substantially similar images of the line of best focus in the third test area and the first and/or second test areas indicates substantially no substrate plane tilt about the first axis, and wherein the absence of similar images of the line of best focus in the third test area and the first and/or second test areas indicates the presence of substrate plane tilt about the first axis.

7. The method of claim 6, wherein the images of the line of best focus in the first and second test areas are averaged to form an averaged image for comparison to the image of the line of best focus in the third test area to determine substrate plane tilt and image plane tilt about the first axis.

8. The method of claim 6, wherein the first and second test areas are aligned along the direction of the first axis, and the third test area is aligned parallel and offset to said direction and aligned between the first and second test areas along the direction of the second axis.

9. The method of claim 1, wherein relative locations of the images of the line of best focus in the first and second test areas are compared to determine if the images are substantially similar.

10. The method of claim 1, wherein the series of exposures for the first and second test areas are sequentially made in the direction of the first axis.

11. The method of claim 10, wherein the photolithography system is a scanning-type system, and the series of exposures are scanning exposures carried out in a desired synchronization with the substrate in the direction of the first axis.

12. The method of claim 1, further comprising:

stepping the substrate to a different position in a direction of a third axis orthogonal to the first and second axes; and subjecting at least one of the first and second test areas to substantially same series of exposures at said different position, wherein the image of such series of exposure at said one of the first and second test areas at said different positions is used to determine the image plane tilt.

13. The method of claim 12, wherein relative locations of the images of the line of best focus in the first and second test areas at the same position in the direction of the third axis are compared to determine if the images are substantially similar.

14. In a photolithography system having an exposure apparatus that exposes a pattern onto a photosensitive surface in a substrate plane of a substrate that nominally lies in an image plane of the exposure apparatus defined by two orthogonal first and second axes, a method for aligning the image plane and substrate plane, comprising:

subjecting a first test area to a series of exposures across the first test area;

subjecting a second test area, which is displaced from the first test area in a direction of the first axis, to a substantially same series of exposures across the second test area;

developing images from the exposures in the first and second test areas, wherein the image in each test area includes an image of at least a line of best focus where the image plane and the substrate plane coincide;

identifying a presence of substrate plane tilt and image plane tilt about the second axis by comparing the images in the first and second test areas;

determining a magnitude of an image plane tilt and a magnitude of the substrate plane tilt about the second axis; and aligning the substrate plane with the image plane of the substrate based on the determined substrate plane tilt and image plane tilt.

15. The method of claim 14, wherein a presence of substantially similar images of the line of best focus in the first and second test areas indicates substantially no substrate plane tilt about the second axis, and wherein absence of similar images of the line of best focus in the first and second test areas indicates the presence of substrate plane tilt about the second axis.

16. The method of claim 14, wherein the determined magnitude of the image plane tilt and substrate plane tilt are used to calibrate the photolithography system for aligning other substrates.

* * * * *

UNITED STATES PATENT AND TRADEMARK OFFICE
CERTIFICATE OF CORRECTION

PATENT NO. : 6,562,528 B2 Page 1 of 1
DATED : May 13, 2003
INVENTOR(S) : W. Thomas Novak It is certified that error appears in the above-identified patent and that said Letters Patent is hereby corrected as shown below:

Column 12,
Line 45, "plant" should read -- plane --.

Signed and Sealed this

Twenty-second Day of July, 2003

JAMES E. ROGAN
*Director of the United States Patent and Trademark Office*